(12) United States Patent
Liang

(10) Patent No.: US 8,852,993 B2
(45) Date of Patent: Oct. 7, 2014

(54) ABSORBER LAYER FOR A THIN FILM PHOTOVOLTAIC DEVICE WITH A DOUBLE-GRADED BAND GAP

(71) Applicant: Intermolecular, Inc., San Jose, CA (US)

(72) Inventor: Haifan Liang, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/187,029

(22) Filed: Feb. 21, 2014

(65) Prior Publication Data

US 2014/0170802 A1    Jun. 19, 2014

Related U.S. Application Data

(63) Continuation of application No. 13/331,793, filed on Dec. 20, 2011, now Pat. No. 8,664,033.

(51) Int. Cl.
*H01L 21/00* (2006.01)
*H01L 31/18* (2006.01)

(52) U.S. Cl.
CPC ........................................ *H01L 31/18* (2013.01)
USPC ............... 438/84; 438/102; 257/E21.068

(58) Field of Classification Search
USPC ........................... 438/56, 590; 257/E21.077
See application file for complete search history.

(56) References Cited

U.S. PATENT DOCUMENTS

| | | | |
|---|---|---|---|
| 6,258,620 B1 * | 7/2001 | Morel et al. | 438/57 |
| 2009/0226717 A1 * | 9/2009 | Basol | 428/336 |
| 2011/0136293 A1 * | 6/2011 | Aksu et al. | 438/84 |
| 2011/0287579 A1 * | 11/2011 | Lee et al. | 438/95 |

* cited by examiner

*Primary Examiner* — Cheung Lee

(57) ABSTRACT

A gallium-containing alloy is formed on the light-receiving surface of a CIGS absorber layer, and, in conjunction with a subsequent selenization or anneal process, is converted to a gallium-rich region at the light-receiving surface of the CIGS absorber layer. A second gallium-rich region is formed at the back contact surface of the CIGS absorber layer during selenization, so that the CIGS absorber layer has a double-graded gallium concentration that increases toward the light-receiving surface and toward the back contact surface of the CIGS absorber layer. The double-graded gallium concentration advantageously produces a double-graded bandgap profile for the CIGS absorber layer.

7 Claims, 14 Drawing Sheets

ABSORBER LAYER FOR A THIN FILM PHOTOVOLTAIC DEVICE WITH A DOUBLE-GRADED BAND GAP

CROSS-REFERENCE TO RELATED APPLICATIONS

This is a Continuation Application of U.S. patent application Ser. No. 13/331,793, filed on Dec. 20, 2011, which is herein incorporated by reference for all purposes.

BACKGROUND

1. Field of the Invention

This invention relates to thin film photovoltaic devices, and more particularly, to an absorber layer for a thin film photovoltaic device that has a double-graded band gap, and methods of forming the same.

2. Description of the Related Art

Solar cells are photovoltaic devices that convert light into electrical energy, and have been developed as clean, renewable energy sources to meet growing energy needs worldwide. The relatively high manufacturing costs associated with conventional crystalline silicon solar cells, which use thick substrates of high-quality material, is driving the development of large area thin film photovoltaic (TFPV) devices. TFPV devices may be formed from thin (<10 micron) films of amorphous, nanocrystalline, micro-crystalline, or mono-crystalline materials, and when fabricated on low-cost substrates, provide an economical alternative to conventional crystalline silicon solar cells.

TFPV devices that employ copper-indium-gallium-selenide (CIGS) absorber layers are of special interest, since CIGS absorbers have demonstrated high lab-cell efficiency (>20%) and large-area module efficiency (>15%). This is because CIGS films have a high absorption coefficient (i.e., approximately $10^5$/cm), bandgaps in the range of 1.0 eV (for copper-indium-selenide) to 1.65 eV (for copper-gallium-selenide), and are efficient absorbers across the entire visible spectrum. Furthermore, CIGS absorbers generally consist of earth-abundant materials, making CIGS-based TFPV devices scalable for high-volume manufacturing.

"Double grading" the bandgap of the CIGS absorber is a method known in the art to increase the efficiency of CIGS solar cells. In a CIGS absorber layer that has a double-graded bandgap profile, the bandgap of the CIGS layer increases toward the front surface and toward the back surface of the CIGS layer, with a bandgap minimum located in a center region of the CIGS layer. The increasing bandgap profile at the front surface of the CIGS layer, i.e., the surface that receives incident light, discourages the generation of charge carriers near this surface, thereby reducing unwanted charge carrier recombination before the charge carriers can reach the appropriate electrode. The increasing bandgap profile at the back surface of the CIGS layer creates a back surface field, which reduces recombination at the back surface and enhances carrier collection.

Co-evaporation is one technique known in the art for producing a double-graded bandgap in a CIGS absorber layer. The co-evaporation process can produce a gallium (Ga) rich region at the front and back surfaces of a CIGS absorber layer and a gallium-poor region in the center of the CIGS absorber layer. However, co-evaporation is a relatively complex process that is not as economical or as easily implemented as other deposition processes known in the art. In a 2-step process, Cu—In—Ga metal precursors are deposited first, followed by a second selenization process to form a CIGS absorber layer. The 2-step process is generally more suited to large-scale low-cost manufacturing compared to the co-evaporation process. However, because gallium has slower reaction kinetics with selenium (Se) than with indium (In), gallium tends to accumulate towards the back surface of the CIGS layer during the selenization process, thereby creating a single grading in the bandgap profile, i.e., the bandgap of the CIGS layer increases from the front surface to the back surface. Double grading of the bandgap profile is then typically achieved by the incorporation of sulfur (S) at the front surface of the CIGS layer. However, sulfur incorporation adds considerable complexity to the deposition process and produces a TFPV absorber material (copper-indium-gallium-sulfur) of lower quality compared to CIGS.

In light of the above, there is a need in the art for an economical method of creating a CIGS absorber layer having a double-graded band gap that does not use sulfur incorporation.

SUMMARY

Embodiments of the invention set forth a method of forming a copper-indium-gallium-selenide (CIGS) absorber layer in a thin film photovoltaic device with a double-graded band gap and a double-graded gallium concentration. In general, a gallium-containing alloy is formed on the light-receiving surface of a CIGS absorber layer, and, in conjunction with a subsequent selenization or anneal process, is converted to a gallium-rich region at the front surface of the absorber layer.

According to one embodiment of the present invention, a method of forming an absorber layer for a thin-film solar cell includes the steps of depositing a copper-indium-gallium layer on a substrate, forming an alloy on a first surface of the copper-indium-gallium layer that includes gallium (Ga) and selenium (Se), and performing a selenization process on the substrate that converts the gallium-containing alloy to a gallium-rich region at the first surface of the absorber, wherein forming the gallium-containing alloy on the first surface of the copper-indium-gallium layer comprises maintaining the substrate at a temperature lower than a temperature at which the selenium-containing gas reacts with the copper-indium-gallium layer.

According to another embodiment of the present invention, a method of forming an absorber layer for a thin-film solar cell includes the steps of depositing a copper-indium-gallium layer on a substrate, exposing the copper-indium-gallium layer to trimethyl gallium (TMGa) and a selenium (Se) containing gas to form a $Ga_xSe_y$-containing layer on a first surface of the copper-indium-gallium layer, and forming a gallium-rich region at the first surface of the copper-indium-gallium layer by annealing the $Ga_xSe_y$-containing layer and converting the deposited $Ga_xSe_y$-containing layer to the gallium-rich region, wherein exposing the copper-indium-gallium layer to TMGa and a selenium-containing gas comprises maintaining the substrate at a temperature lower than a temperature at which the selenium-containing gas reacts with the copper-indium-gallium layer.

According to yet another embodiment of the present invention, a method of forming an absorber layer for a thin-film solar cell includes the steps of depositing a copper-indium-gallium layer on a substrate, the copper-indium-gallium layer having a gallium-rich region, depositing a gallium layer on a first surface of the copper-indium-gallium layer via thermal pyrolysis of TMGa, converting the gallium layer to a $Ga_xSe_y$-containing layer via a selenization process, and thermally converting the $Ga_xSe_y$-containing layer to a gallium-rich region at the first surface of the copper-indium-gallium layer.

BRIEF DESCRIPTION OF THE DRAWINGS

So that the manner in which the above recited features of embodiments of the invention can be understood in detail, a more particular description of embodiments of the invention, briefly summarized above, may be had by reference to the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
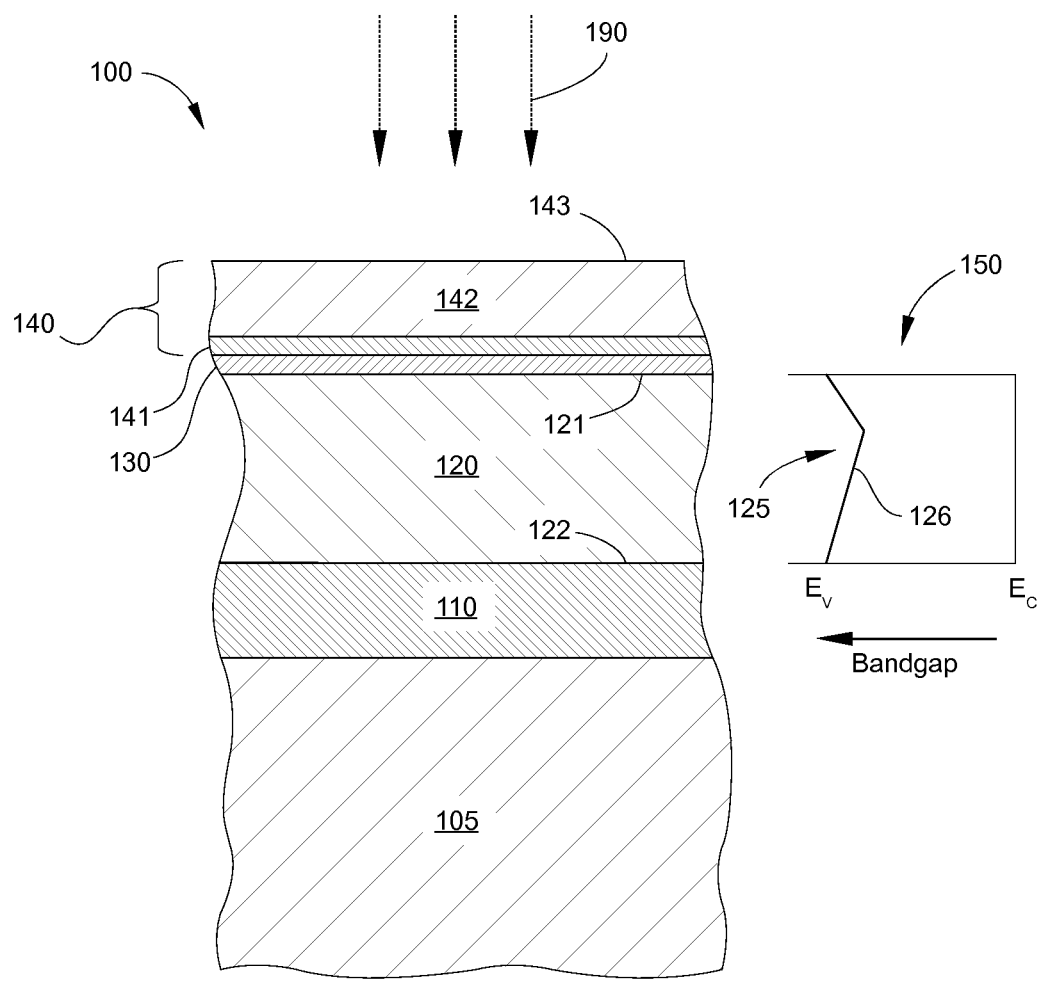
FIG. 1 is a schematic cross-sectional view of a thin film photovoltaic device with a copper-indium-gallium-selenide (CIGS) absorber layer, configured according to embodiments of the invention.

FIG. 1 is a schematic cross-sectional view of a thin film photovoltaic (TFPV) device 100 with a copper-indium-gallium-selenide (CIGS) absorber layer 120, configured according to embodiments of the invention. TFPV device 100 includes a back contact layer 110, CIGS absorber layer 120, a buffer layer 130, and a transparent conductive oxide (TCO) stack 140, arranged as shown on a substrate 105 to form a TFPV device stack. Light 190 is incident on a front surface 143 of TFPV device 100, passes through TCO stack 140 and buffer layer 130, and is absorbed by CIGS absorber layer 120 and converted to electrical energy.

Substrate 105 may be a rigid or flexible substrate. Examples of rigid substrates suitable for use as substrate 105 include float glass, low-iron glass, borosilicate glass, specialty glass for high temperature processing, stainless steel, carbon steel, aluminum, copper, titanium, molybdenum, plastics, etc. Examples of flexible substrates suitable for use as substrate 105 include polyimide, flexible glass, cladded metal foils, etc.

Back contact layer 110 serves as the primary current conductor layer of TFPV device 100 and is also configured to reflect most unabsorbed light back into CIGS absorber layer 120. In one embodiment, back contact layer 110 comprises a molybdenum (Mo) layer that has a thickness that is between about 0.3 microns and about 1.0 microns. In addition to high reflectivity, it is desirable for back contact layer 110 to have relatively high electrical conductivity, good ohmic contact to CIGS absorber layer 120, ease of bonding to tabs for external connectivity, ease of scribing or other removal, good thermo-mechanical stability, and chemical resistance during subsequent processing, among properties. Back contact layer 110 may be formed by any number of deposition technologies, including physical vapor deposition (PVD) or "sputtering," evaporation, chemical vapor deposition (CVD), atomic layer deposition (ALD), plating, etc.

CIGS absorber layer 120 is a p-type absorber layer having a thickness of between about 1.0 micron and about 4.0 microns and includes a copper-indium-gallium-selenide material formed according to embodiments of the invention. Specifically, CIGS absorber layer 120 has a double-graded bandgap profile 125, which is illustrated schematically in bandgap profile diagram 150 shown in FIG. 1. For clarity, bandgap profile diagram 150 is disposed adjacent to and aligned with CIGS absorber layer 120 to better illustrate the change in the bandgap value 126 of CIGS absorber layer 120 with respect to a light-receiving surface 121 and a back contact surface 122 of CIGS absorber layer 120. Bandgap value 126 represents the energy difference between the top of the valence band and the bottom of the conduction band in CIGS absorber layer 120. As shown in bandgap profile diagram 150, bandgap profile 125 is "double-graded," i.e., the bandgap value 126 increases toward light-receiving surface 121 and also toward back contact surface 122, with a bandgap minimum located in a center region of the CIGS absorber layer 120. Because bandgap value 126 increases at light-receiving surface 121, the generation of carriers near light-receiving surface 121 is discouraged, thereby advantageously reducing recombination. Because bandgap value 126 increases at back contact surface 122, a back surface field is created, which reduces recombination at back contact surface 122 and enhances carrier collection. Bandgap profile 125 is double-graded since the concentration of gallium in CIGS absorber layer 120 is also double-graded, with an increased concentration of gallium at light-receiving surface 121 and also at back contact surface 122.

According to embodiments of the invention, CIGS absorber layer 120 is formed on back contact layer 110 in a two-step process that does not include sulfur incorporation. It is noted that embodiments of the invention produce a double-graded concentration of gallium in CIGS absorber layer 120 so that CIGS absorber layer 120 has a double-graded bandgap profile 125, as illustrated in bandgap profile diagram 150. First, a precursor film that includes copper, indium, and gallium is deposited on back contact layer 110, with co-sputtering, evaporation, electroplating, solution-based synthesis, or other metal deposition processes known in the art. For example, a co-sputtering process may be performed using binary copper-gallium and indium sputter targets. The copper-indium-gallium precursor film may comprise multiple layers or a single layer, and may be a dense or porous film. Subsequent to deposition of the copper-indium-gallium precursor film, one of several possible embodiments of the invention is used to form CIGS absorber layer 120 with a double-graded concentration of gallium, so that CIGS absorber layer 120 has double-graded bandgap profile 125.

In one embodiment, a $Ga_xSe_y$ layer is formed on the copper-indium-gallium precursor film using trimethyl gallium (TMGa) gas and a selenium (Se) containing gas in an initial, low-temperature selenization process, in which the selenium-containing gas used in the selenization process does not react with the copper-indium-gallium precursor film. A subsequent high-temperature selenization process forms the typical gallium-rich region at back contact surface 122 of CIGS absorber layer 120 while simultaneously converting the deposited $Ga_xSe_y$ layer to a gallium-rich region at light-receiving surface 121 of CIGS absorber layer 120. The embodiment is described in greater detail below in conjunction with FIG. 2 and FIGS. 3A-3C.

In another embodiment, the copper-indium-gallium precursor film first undergoes a conventional selenization process to form a CIGS absorber layer that has the typical gallium-rich region at back contact surface 122 and therefore has a single-graded bandgap profile. Then, using TMGa and a selenium-containing gas, a $Ga_xSe_y$ layer is formed on light-receiving surface 121 of the single-graded CIGS absorber layer, and a subsequent anneal process converts the deposited $Ga_xSe_y$ to a gallium-rich region at the front surface of the absorber. The embodiment is described in greater detail below in conjunction with FIG. 4 and FIGS. 5A-5D.

In yet another embodiment, the copper-indium-gallium precursor film first undergoes a conventional selenization process to form a CIGS absorber layer that has the typical gallium-rich region at back contact surface 122 and a single-graded bandgap profile. Then, thermal pyrolysis of TMGa is used to deposit a gallium layer on light-receiving surface 121 of the single-graded CIGS absorber layer, and a subsequent selenization process forms a $Ga_xSe_y$ layer from the deposited gallium. Depending on the temperature of the selenization process, an anneal process may be used in a final step to convert the $Ga_xSe_y$ layer to a gallium-rich region at light-receiving surface 121 of CIGS absorber layer 120. The embodiment is described in greater detail below in conjunction with FIGS. 6 and 7A-7E.

Buffer layer 130 of TFPV device 100 is an n-type buffer layer deposited on CIGS absorber layer 120. In one embodiment, buffer layer 130 comprises a cadmium sulfide (CdS) layer that has a thickness between about 30 nm and about 100 nm. Other n-type buffer layer materials suitable for use in buffer layer 130 include ZnS, $In_2S_3$, $In_2(S,Se)_3$, CdZnS, ZnO, Zn(O,S), (Zn,Mg)O, etc. Buffer layer 130 may be deposited using chemical bath deposition (CBD), chemical surface deposition (CSD), PVD, printing, plating, ALD, ion-layer-gas-reaction (ILGAR), or evaporation.

TCO stack 140 serves as part of the front contact structure of TFPV device 100 and is formed from transparent conductive metal oxide materials. TCO stack 140 collects charge across the face of TFPV device 100 and conducts the charge to tabs used to connect TFPV device 100 to external loads. TCO stack 140 includes a low resistivity top TCO layer 142 and an optional intrinsic zinc oxide (iZnO) layer 141. Optional intrinsic zinc oxide layer 141 is a high resistivity material that has been found to reduce sensitivity of TFPV device to lateral non-uniformities caused by differences in composition or defect concentration in the absorber and/or buffer layers. Optional intrinsic zinc oxide layer 141 is formed on CIGS absorber layer 120 and is generally between 40 to 60 nm in thickness, but in some embodiments is up to about 150 nm in thickness. Optional intrinsic zinc oxide layer 141 is typically formed using deposition processes well-known in the art, including reactive PVD, CVD, plating, or printing. Low resistivity top TCO layer 142 is formed on optional intrinsic zinc oxide layer 141, and typically has a thickness between about 100 nm and 1 micron. Suitable materials for low resistivity top TCO layer 142 include aluminum-doped zinc oxide (Al:ZnO), indium tin oxide (InSnO or ITO), indium zinc oxide (InZnO), boron-doped zinc oxide (B:ZnO), gallium-doped zinc oxide (Ga:ZnO), fluorine-doped zinc-oxde (F:ZnO), fluorine-doped tin oxide (F:$SnO_2$), etc. Suitable processes for forming low resistivity top TCO layer 142 include reactive PVD, CVD, printing or wet-coating from nano-wires or carbon nanotubes, and the like.

Figure 2:
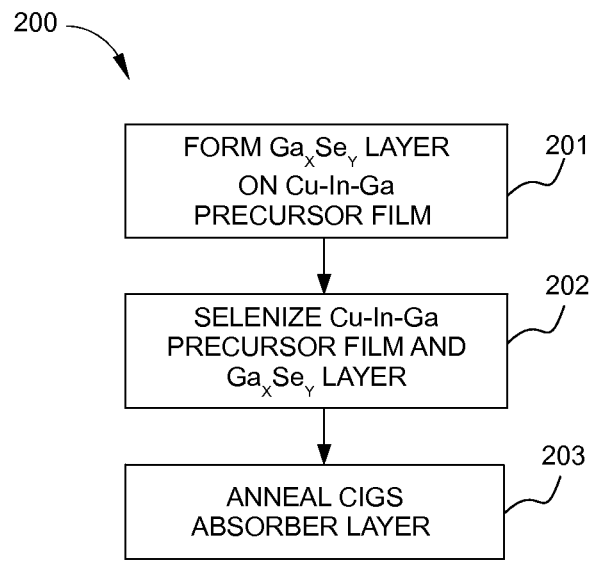
FIG. 2 sets forth a flowchart of method steps in a process sequence for forming a CIGS absorber layer, according to embodiments of the invention.
Figure 3A:
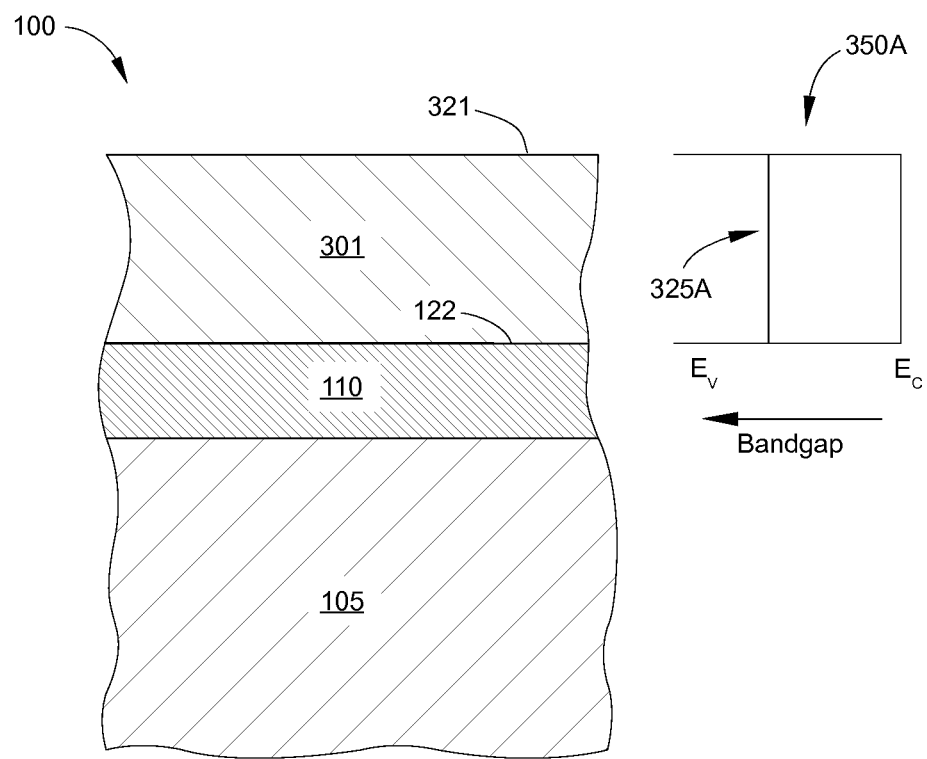
FIGS. 3A-3C sequentially illustrate cross-sectional views of a TFPV device during the execution of the process sequence illustrated in FIG. 2, according to embodiments of the invention.
Figure 3B:
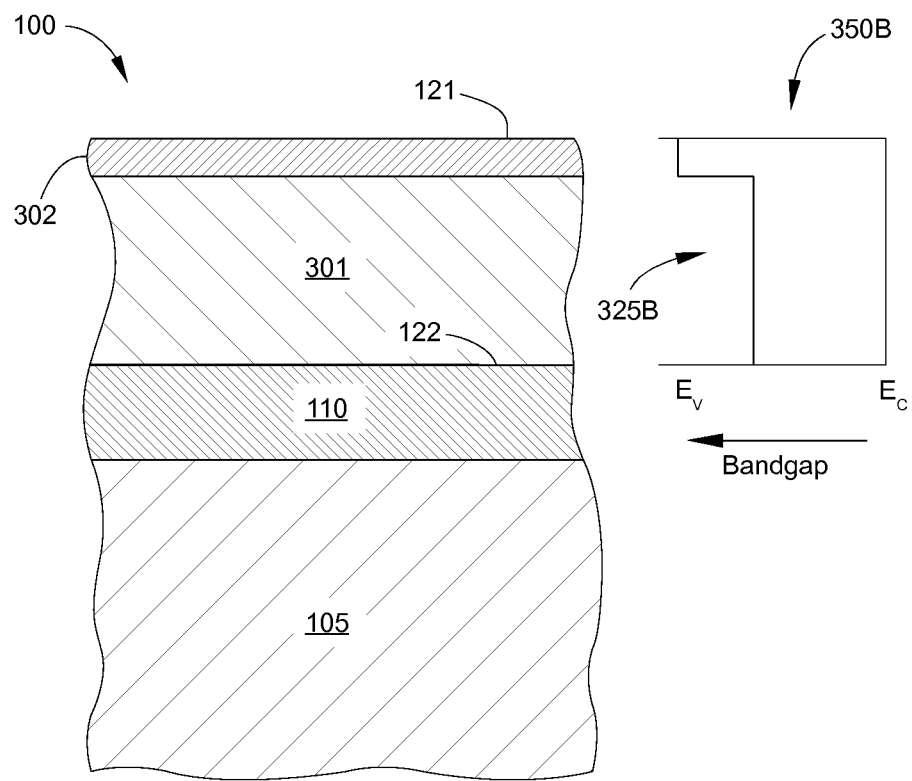
Figure 3C:
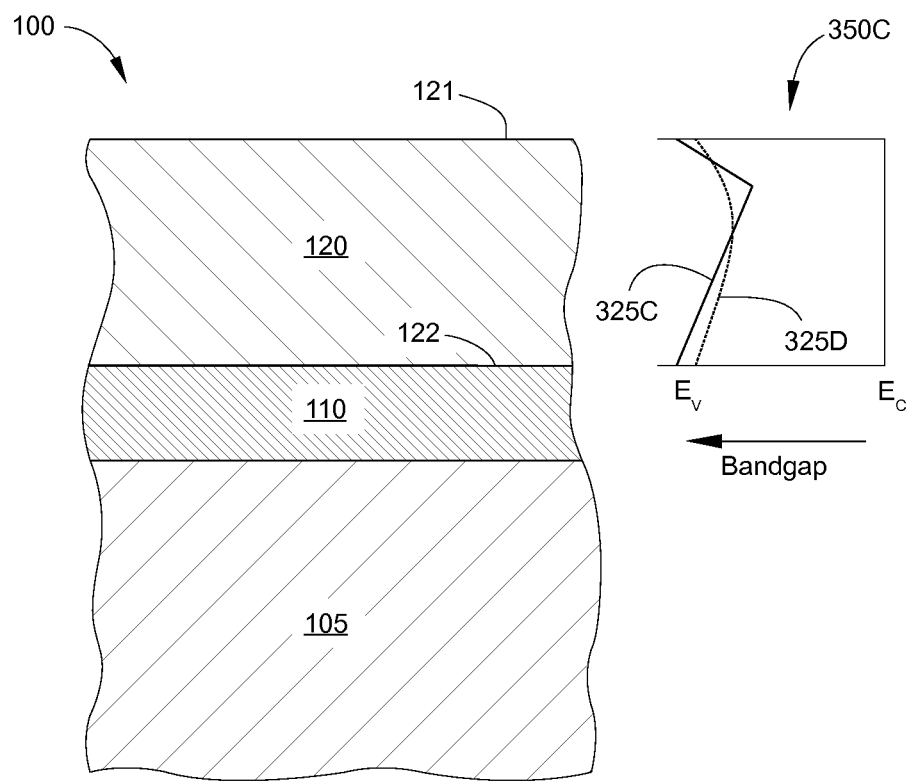

FIG. 2 sets forth a flowchart of method steps in a process sequence 200 for forming CIGS absorber layer 120, according to embodiments of the invention. FIGS. 3A-3C sequentially illustrate cross-sectional views of TFPV device 100 during the execution of process sequence 200, according to embodiments of the invention. Although the method steps are described in conjunction with TFPV device 100, persons skilled in the art will understand that formation of other TFPV devices using process sequence 200 is within the scope of the invention. Prior to the first step of method 200, back contact layer 110 is deposited on substrate 105, and a copper-indium-gallium precursor film 301 is formed on back contact layer 110 (shown in FIG. 3A). As shown in bandgap profile diagram 350A in FIG. 3A, the bandgap profile 325A of copper-indium-gallium precursor film 301 is substantially constant from back contact surface 122 to a front surface 321 of copper-indium-gallium precursor film 301. In an exemplary embodiment, copper-indium-gallium precursor film 301 has a thickness of 200 nm to 1000 nm and a composition range of copper to indium and gallium of 0.7 to 0.95 and gallium to gallium and indium of 0.1 to 0.4.

As shown in FIG. 2, method 200 begins at step 201, in which the reaction of TMGa vapor with a selenium-containing gas is used to form a $Ga_xSe_y$ layer 302 on copper-indium-gallium precursor film 301, (illustrated in FIG. 3B). In addition, the reaction takes place between TMGa vapor and the selenium-containing gas is performed at a relatively low temperature, so that the selenium-containing gas used in the selenization process does not react with copper-indium-gallium precursor film 301. In such a selenization process, the temperature of substrate 105 is maintained below the threshold reaction temperature for the selenization of copper-indium-gallium precursor film 301, so that $Ga_xSe_y$ layer 302 is formed on copper-indium-gallium precursor film 301 as shown in FIG. 3B. Bandgap profile diagram 350B in FIG. 3B illustrates that bandgap profile 325B of copper-indium-gallium precursor film 301 remains substantially constant, since little or no gallium diffuses into copper-indium-gallium precursor film 301 during step 201. However, the high concentration of gallium in $Ga_xSe_y$ layer 302 results in a higher bandgap at light-receiving surface 121.

Various selenium-containing gases may be used in step 201 to form $Ga_xSe_y$ layer 302, including hydrogen selenide ($H_2Se$), selenium vapor, and/or diethylselenide. In one embodiment, step 201 takes place in either a batch furnace or an in-line furnace at a deposition temperature between about 20° C. and about 350° C., and hydrogen selenide is used as the selenium-containing gas. In such an embodiment, $Ga_xSe_y$ layer 302 is deposited with a thickness of about 10 nm to 100 nm using the reaction described in Equation 1:

$$3(CH_3)_3Ga_{(g)} + 4H_2Se_{(g)} \tfrac{1}{2}H_{2(g)} \rightarrow Ga_2Se_{3(s)} + GaSe_{(s)} + 9CH_{4(g)} \qquad (1)$$

In step 202, selenization of copper-indium-gallium precursor film 301 and $Ga_xSe_y$ layer 302 is performed by reaction with a selenium-containing gas that comprises hydrogen selenide, selenium vapor, diethylselenide, and/or a combination thereof. The selenization process of step 202 forms CIGS absorber layer 120 from copper-indium-gallium precursor film 301 and $Ga_xSe_y$ layer 302, as shown in FIG. 3C. The reaction with the selenium-containing gas takes place at an elevated temperature (e.g., between about 400° C. and 550° C.) so that gallium present in copper-indium-gallium precursor film 301 reacts with the selenium-containing gas to form a CIGS absorber layer that is gallium-rich at back contact surface 122. However, at such reaction temperatures, gallium contained in $Ga_xSe_y$ layer 302 has limited mobility due to the strong Ga—Se bond, and remains concentrated near light-receiving surface 121 of CIGS absorber layer 120. Consequently, upon completion of step 202, CIGS absorber layer 120 has a double-graded bandgap profile 325C, as illustrated in bandgap profile diagram 350C of FIG. 3C.

In one embodiment, the selenium-containing gas comprises hydrogen selenide and the reaction temperature is between about 400° C. and 550° C. In an another embodiment, the selenium-containing gas comprises selenium vapor and the reaction temperature is between about 400° C. and 600° C. It is noted that the processes described for step 202 may be performed in the same batch furnace or in-line furnace that performs the processes of step 201. Consequently, implementation of method 200 is substantially more economical and less complex than processes in which multiple processing chambers are required for the formation of CIGS absorber layer 120.

In optional step 203, double-graded bandgap profile 325C illustrated in FIG. 3C is tuned or optimized in a final anneal process. The anneal process of step 203 can adjust gallium distribution in CIGS absorber layer 120, thereby altering the double-graded bandgap profile 325C. For example, in one embodiment, the anneal process of step 203 adjusts double-graded bandgap profile 325C to a double-graded bandgap profile 325D. In some embodiments, the anneal process of step 203 is performed at a temperature greater than or equal to 500° C. It is noted that in some embodiments, depending on the reaction temperature and duration of the selenization process of step 202, step 203 may not be necessary. Specifically, in some embodiments, double-graded bandgap profile 325C may be adjusted to double-graded bandgap profile 325D during the selenization process of step 202, i.e., when the selenization process of step 202 takes place at a sufficiently high temperature and for a sufficiently long duration.

Figure 4:
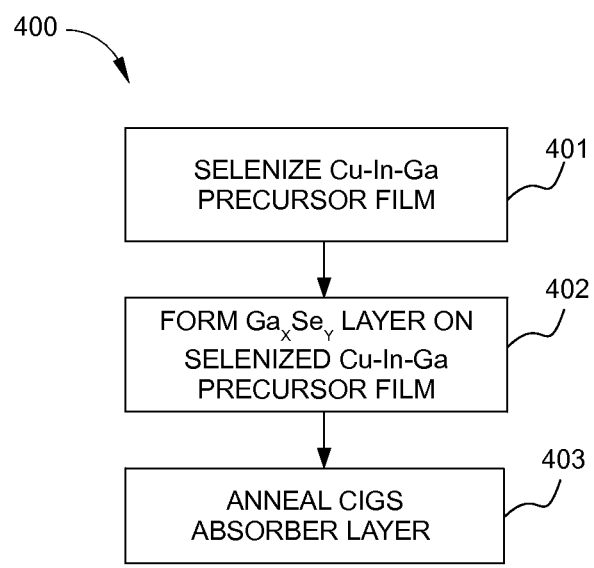
FIG. 4 sets forth a flowchart of method steps in a process sequence for forming a CIGS absorber layer, according to embodiments of the invention.

FIG. 4 sets forth a flowchart of method steps in a process sequence 400 for forming CIGS absorber layer 120, according to embodiments of the invention. FIGS. 5A-5D sequentially illustrate cross-sectional views of TFPV device 100 during the execution of process sequence 400, according to embodiments of the invention. Although the method steps are described in conjunction with TFPV device 100, persons skilled in the art will understand that formation of other TFPV devices using process sequence 400 is within the scope of the invention. Prior to the first step of method 400, back contact layer 110 and copper-indium-gallium precursor film 301 are deposited on substrate 105 as described above in method 200. Consequently, in bandgap profile diagram 550A in FIG. 5A, the bandgap profile 525A of copper-indium-gallium precursor film 301 is substantially constant over the thickness of copper-indium-gallium precursor film 301.

Figure 5A:
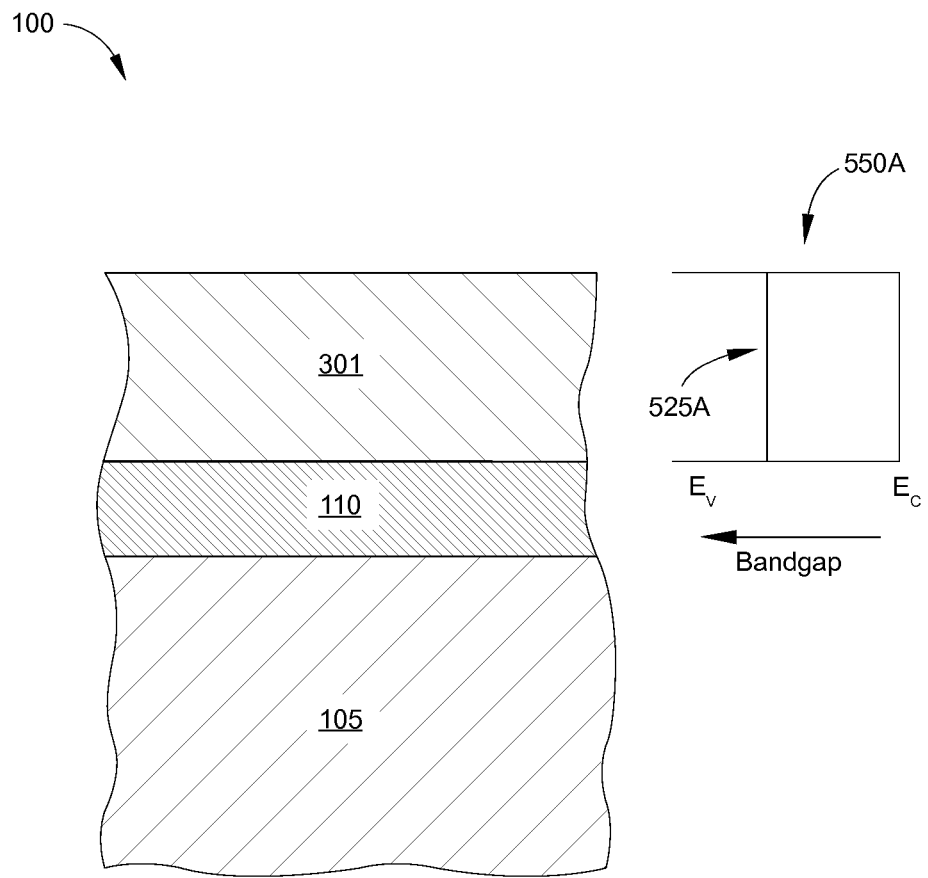
FIGS. 5A-5D sequentially illustrate cross-sectional views of a TFPV device during the execution of the process sequence illustrated in FIG. 4, according to embodiments of the invention.
Figure 5B:
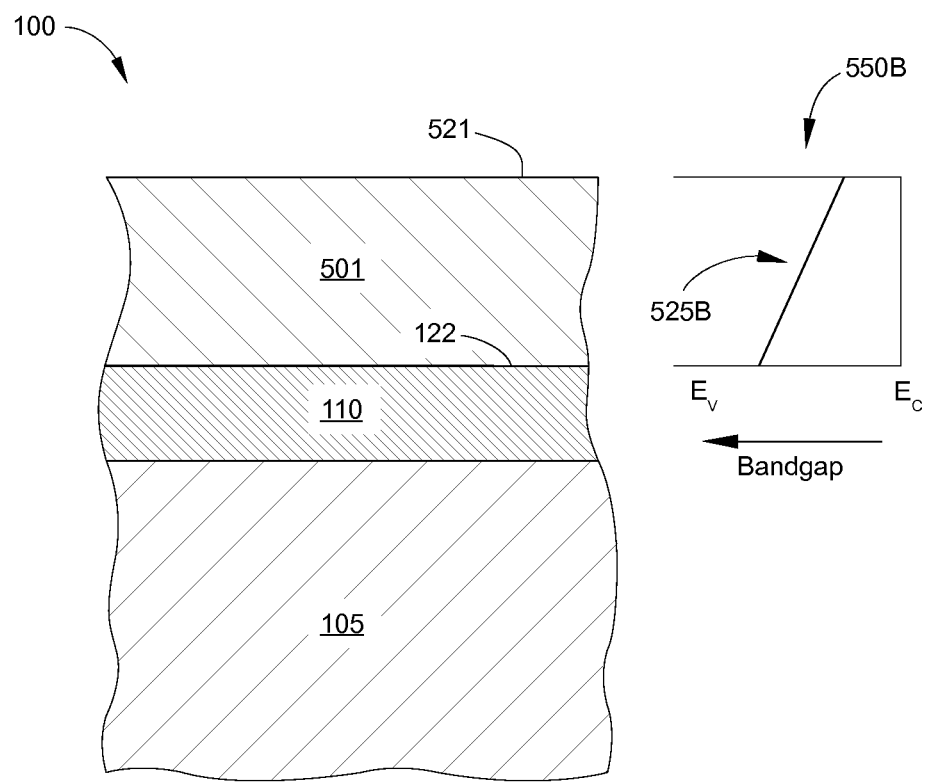

As shown in FIG. 4, method 400 begins at step 401, in which a selenization process known in the art is performed on copper-indium-gallium precursor film 301 to form a CIGS layer 501, as shown in FIG. 5B. Due to gallium's slower reaction kinetics with selenium compared to indium, gallium accumulates towards back contact surface 122 of CIGS layer 501 during the selenization process, so that CIGS layer 501 has a single-graded bandgap profile that increases from front surface 521 of CIGS layer 501 to back contact surface 122. Bandgap profile diagram 550B in FIG. 5B illustrates the single-graded bandgap profile 525B of CIGS layer 501. Selenization processes suitable for use in step 401 may be performed in a batch furnace or in-line furnace, are typically carried out in a temperature range of approximately 400° C. to 500° C., and generally use hydrogen selenide and/or selenium vapor.

Figure 5C:
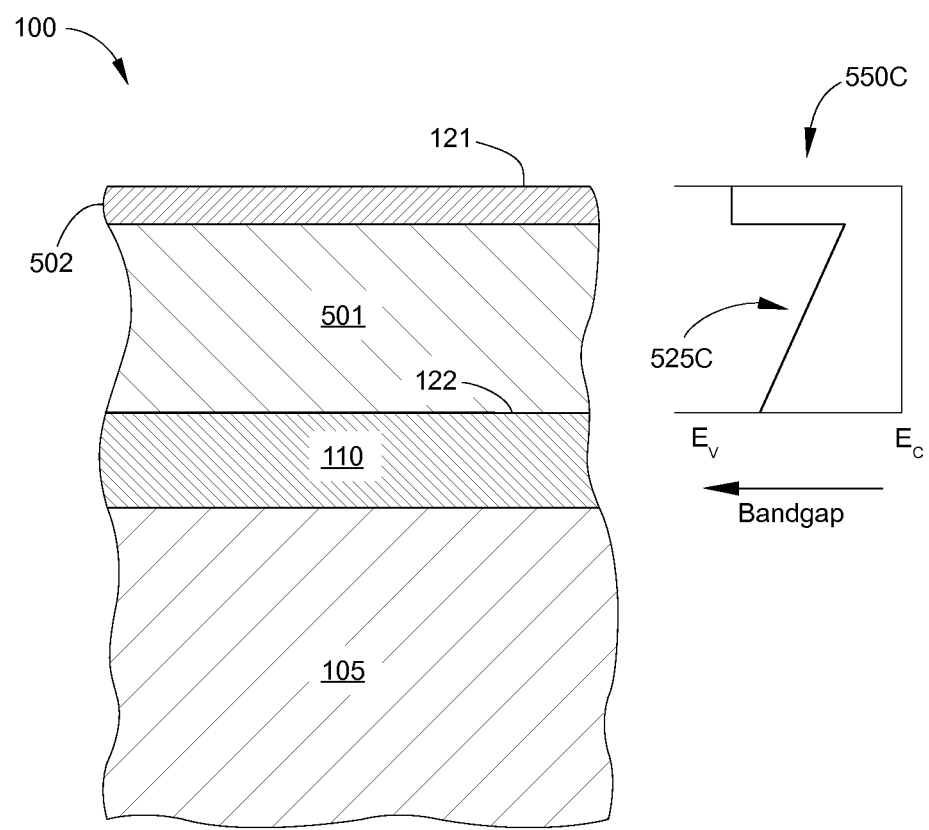

In step 402, the reaction of TMGa vapor with a selenium-containing gas is used to form a $Ga_xSe_y$ layer 502 on CIGS layer 501, illustrated in FIG. 5C. The process of forming $Ga_xSe_y$ layer 502 on CIGS layer 501 is similar to the process of forming $Ga_xSe_y$ layer 302 on copper-indium-gallium precursor film 301 in step 201 of method 200, but differs in one respect. Specifically, the reaction described in Equation 1 can be performed in step 402 at a higher temperature than in step 201 of method 200, e.g., up to about 550° C., since CIGS layer 501 is already selenized in step 401. As illustrated by bandgap profile diagram 550C, bandgap profile 525C of CIGS layer 501 has a single grade that increases toward back contact surface 122, while the high concentration of gallium in $Ga_xSe_y$ layer 502 results in a correspondingly higher bandgap at light-receiving surface 121. It is noted that the processes described for step 402 may be performed in the same batch furnace or in-line furnace that performs the processes of step 401.

Figure 5D:
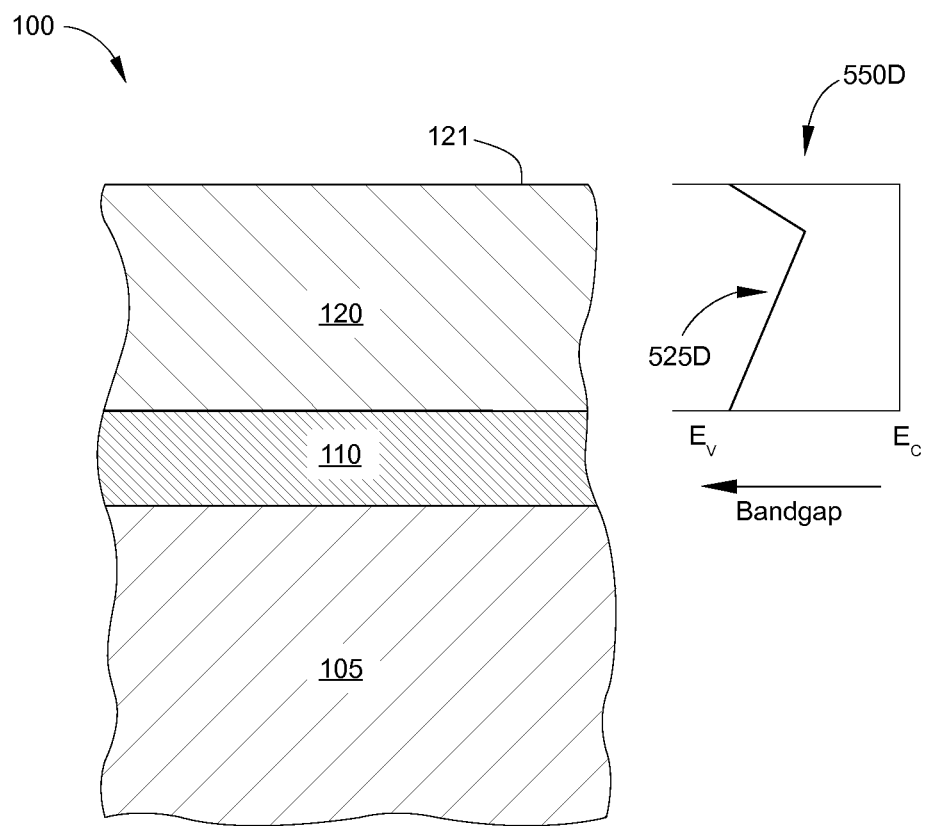

In step 403, an anneal process is performed on CIGS layer 501 and $Ga_xSe_y$ layer 502 to form CIGS absorber layer 120, as illustrated in FIG. 5D. The anneal process of step 403 converts $Ga_xSe_y$ layer 502 into a gallium-rich CIGS region at light-receiving surface 121, so that the bandgap of CIGS absorber layer 120 increases at light-receiving surface 121. Thus, in step 403, CIGS absorber layer 120 is formed with a double-graded bandgap profile, as illustrated by bandgap profile 525D in bandgap profile diagram 550D. The duration and temperature at which the anneal process of step 403 takes place may be selected to adjust bandgap profile 525D as desired. In one embodiment, the anneal process of step 403 is performed at a temperature between about 500° C. and about 600° C. It is noted that the anneal process of step 403 may be performed in the same batch furnace or in-line furnace that performs the processes of steps 401 and 402.

Figure 6:
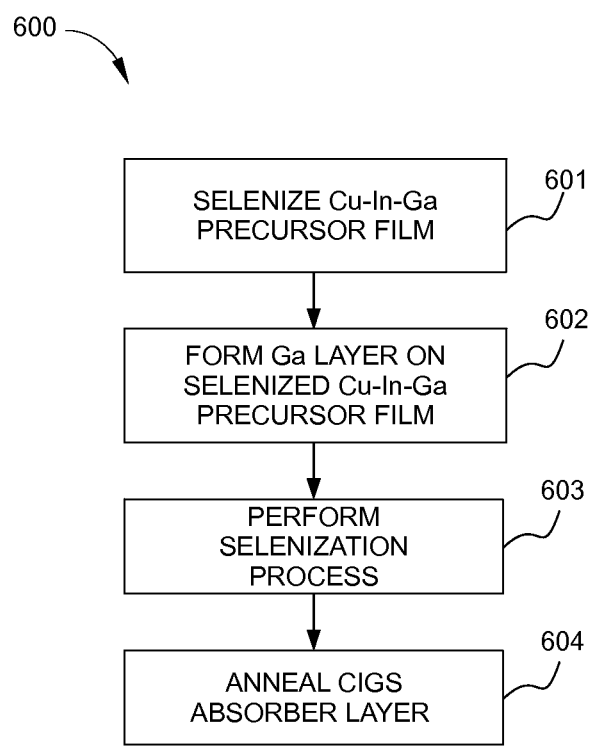
FIG. 6 sets forth a flowchart of method steps in a process sequence 600 for forming a CIGS absorber layer, according to embodiments of the invention.

FIG. 6 sets forth a flowchart of method steps in a process sequence 600 for forming CIGS absorber layer 120, according to embodiments of the invention. FIGS. 7A-7D sequentially illustrate cross-sectional views of TFPV device 100 during the execution of process sequence 600, according to embodiments of the invention. Although the method steps are described in conjunction with TFPV device 100, persons skilled in the art will understand that formation of other TFPV devices using process sequence 600 is within the scope of the invention. Prior to the first step of method 600, back contact layer 110 and copper-indium-gallium precursor film 301 are deposited on substrate 105 as described above in method 200. Consequently, in bandgap profile diagram 750A (FIG. 7A), the bandgap profile 725A of copper-indium-gallium precursor film 301 is substantially constant over the thickness of copper-indium-gallium precursor film 301.

Figure 7A:
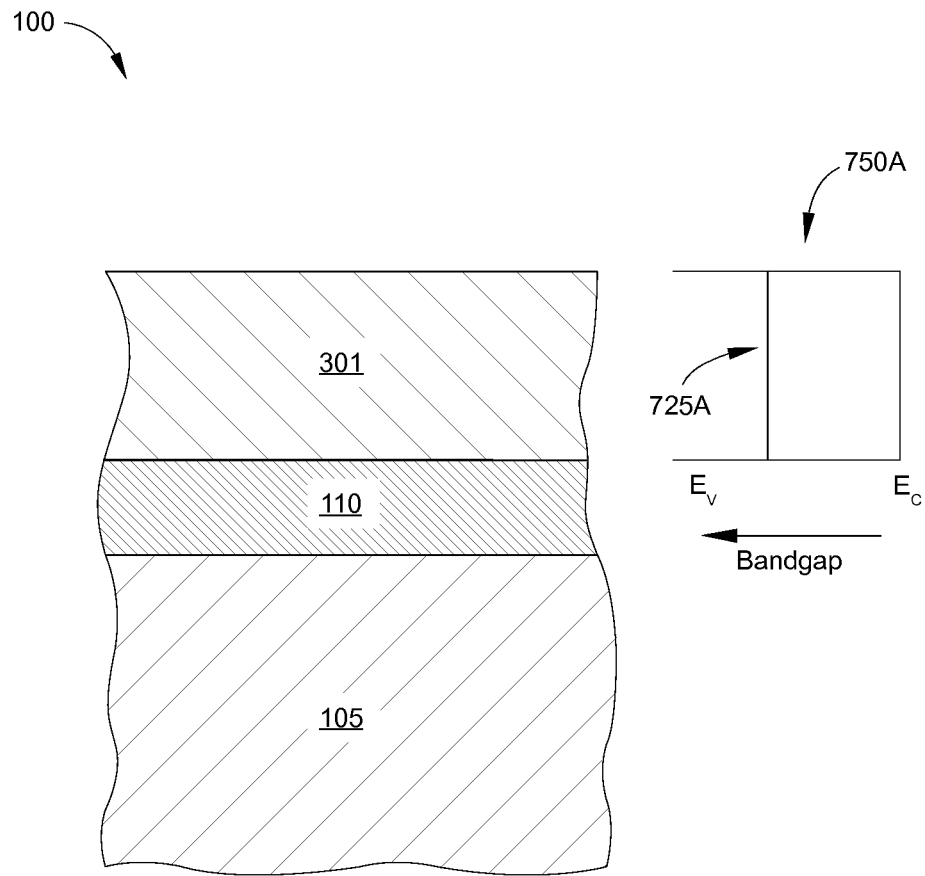
FIGS. 7A-7D sequentially illustrate cross-sectional views of a TFPV device during the execution of the process sequence illustrated in FIG. 6, according to embodiments of the invention.
Figure 7B:
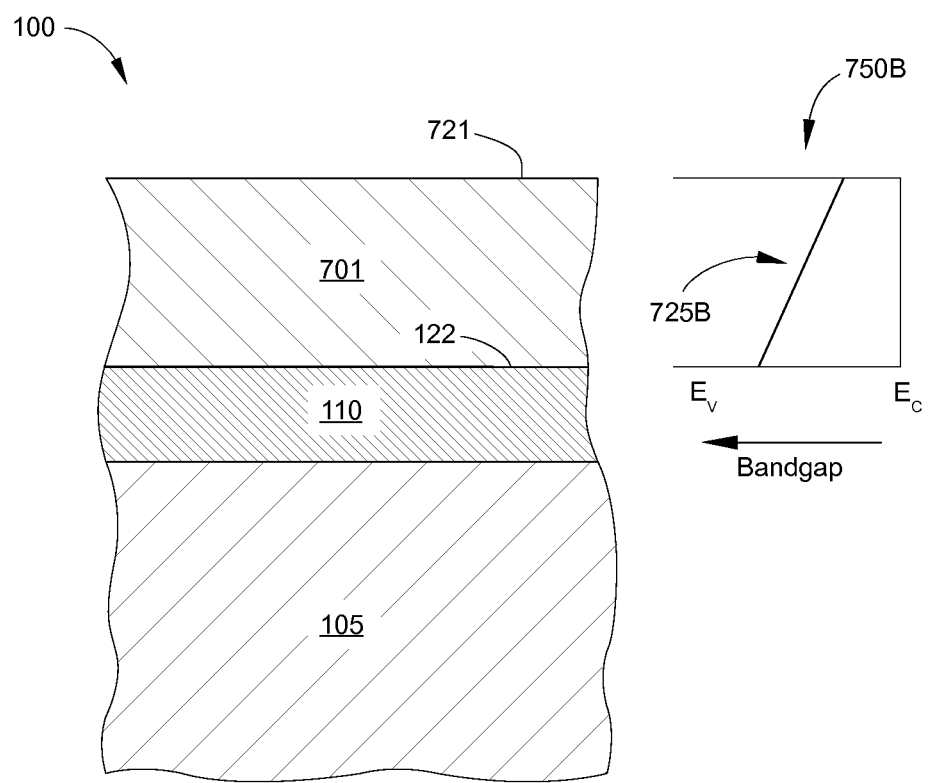

As shown in FIG. 6, method 600 begins at step 601, in which a selenization process known in the art is performed on copper-indium-gallium precursor film 301 to form a CIGS layer 701, as shown in FIG. 7B. Step 601 is substantially similar to step 401 in method 400, so that CIGS layer 701 has a single-graded bandgap profile that increases from front surface 521 of CIGS layer 701 to back contact surface 122. Bandgap profile diagram 750B in FIG. 7B illustrates the single-graded bandgap profile 725B of CIGS layer 701.

Figure 7C:
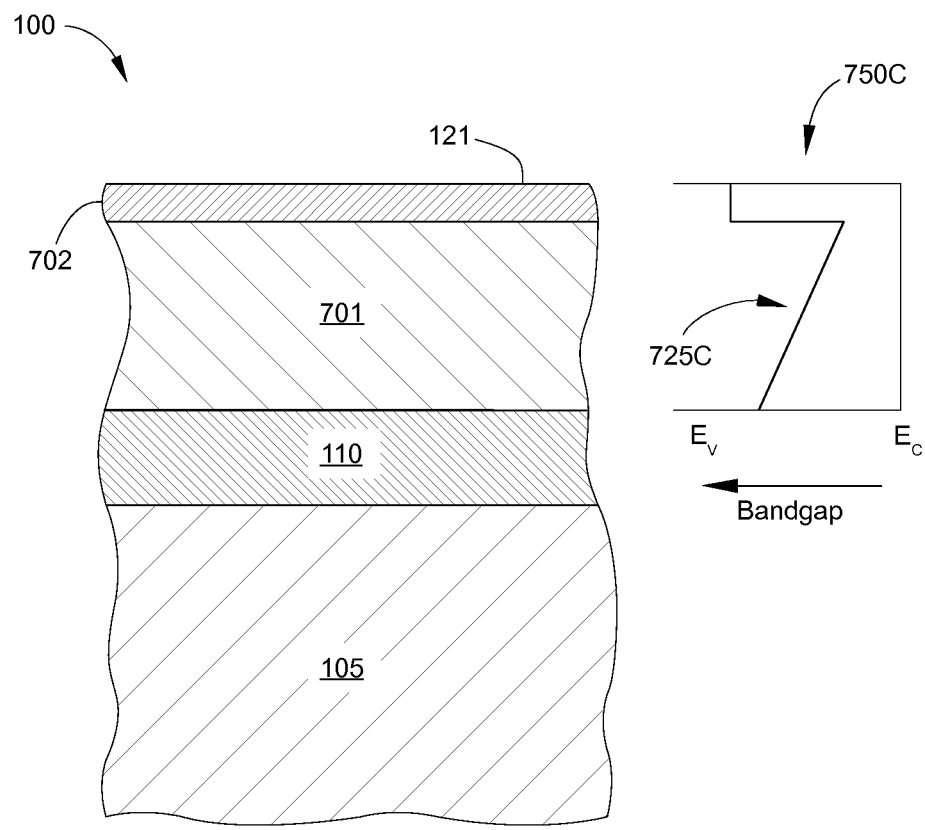
Figure 7D:
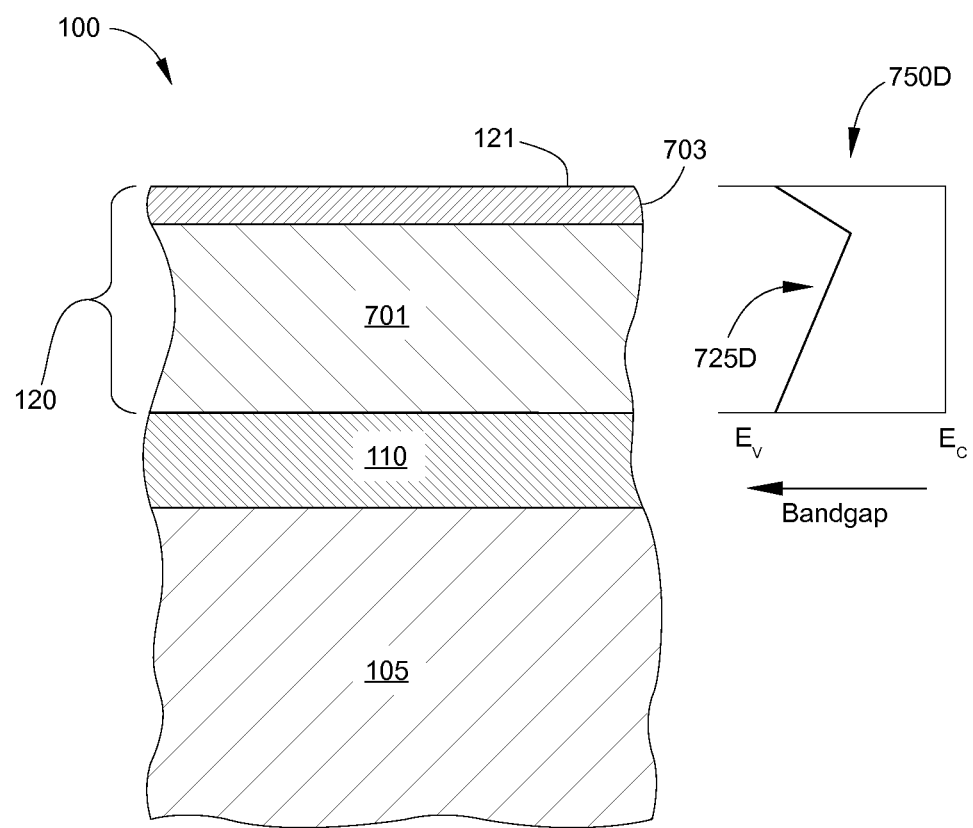

In step 602, a gallium layer 702 is formed on CIGS layer 701, illustrated in FIG. 7C. Gallium layer 702 is formed by exposing CIGS layer 701 to TMGa vapor at a temperature between about 400° C. and 550° C. Thermal pyrolysis of the TMGa vapor results in the deposition of gallium layer 702. It is noted that the processes described for step 602 may be performed in the same batch furnace or in-line furnace that performs the processes of step 601. Bandgap profile diagram 750C (FIG. 7C) illustrates the single-graded bandgap profile 725C of CIGS layer 701 and the high bandgap value at light-receiving surface 121 associated with gallium layer 702.

It is noted that the formation of gallium layer 702 in step 602 results from the thermal decomposition of TMGa on the exposed surface of copper-indium-gallium precursor film 301. This is in contrast to the formation of $Ga_xSe_y$ layer 502 on copper-indium-gallium precursor film 301, in step 402 of method 400, which is a gas-phase reaction that can potentially create unwanted particles the reaction chamber.

In step 603, a selenization process is performed with a selenium-containing gas. Selenization processes suitable for use in step 603 may be performed in a batch furnace or in-line furnace, are typically carried out in a temperature range of approximately 400° C. to 550° C., and generally use hydrogen selenide and/or selenium vapor. The selenization process of step 603 converts gallium layer 702 to a $Ga_xSe_y$ layer 703, illustrated in FIG. 7D, and produces the desired double-graded bandgap profile, as illustrated by bandgap profile 725D in bandgap profile diagram 750D.

In optional step 604, an anneal process is performed on CIGS absorber layer 120. The anneal process of step 604 may be used to further optimize or adjust the bandgap profile of CIGS absorber layer 120. In some embodiments, the anneal process in step 604 is performed at a temperature between about 500° C. and 600° C.

It is noted that the processes described for steps 601-604 may all be performed in the same batch furnace or in-line furnace. Consequently, implementation of method 700 is substantially more economical and less complex than processes in which multiple processing chambers are required for the formation of CIGS absorber layer 120. It is further noted that embodiments of the invention may be performed using any technically feasible deposition techniques known in the art. For example, TFPV device 100 may be formed using single substrate processing equipment, multiple substrate batch-processing equipment, in-line processing, single chamber processing, roll-to-roll processing, and the like. In-line processing may include continuous processing of substrates while moving through an in-line furnace, or the performance of different processes on each substrate in multiple discrete reaction chambers. Such chambers may be isolated mechanically, by gas curtains, etc.

In sum, embodiments of the invention set forth methods for forming a CIGS absorber layer in a thin film photovoltaic device, where the CIGS absorber layer has a double-graded bandgap and a double-graded gallium concentration. One advantage of the invention is that the formation of a CIGS absorber layer with a double-graded bandgap can, according to various embodiments of the invention, be performed sequentially in a single reaction chamber or furnace. Thus, a CIGS absorber layer having superior conversion efficiency can be formed in an economical fashion.

While the foregoing is directed to embodiments of the present invention, other and further embodiments of the invention may be devised without departing from the basic scope thereof, and the scope thereof is determined by the claims that follow.

I claim:

1. A method of forming a thin-film solar cell absorber layer, the method comprising:
    forming a first layer above the substrate, wherein the first layer comprises copper, indium, gallium, and selenium;
    prior to forming a second layer above the first layer, heating the substrate to form a gallium-rich region within the first layer, wherein the step of heating the substrate prior to forming the second layer comprises a selenization process;
    forming a second layer above the first layer, wherein the second layer is formed using trimethyl gallium (TMGa) and a selenium-containing gas; and
    heating the first layer and the second layer.

2. The method of claim 1, wherein exposing the first layer to TMGa and the selenium-containing gas and the heating the first layer and the second layer are performed in a same reaction chamber.

3. The method of claim 1, wherein the heating the first layer and the second layer comprises heating to a temperature between 500° C. and 600° C.

4. The method of claim 1, wherein the selenium-containing gas comprises hydrogen selenide ($H_2Se$).

5. The method of claim 1, wherein a concentration within the absorber layer of copper to indium and gallium is between 0.7 and 0.95.

6. The method of claim 1, wherein a concentration within the absorber layer of gallium to indium and gallium is between 0.1 and 0.4.

7. The method of claim 1, wherein a thickness of the first layer is between 200nm and 1000nm.

* * * * *